United States Patent
Tsorng et al.

(10) Patent No.: US 11,825,625 B2
(45) Date of Patent: Nov. 21, 2023

(54) HOUSING FOR ALIGNING POWER SUPPLY COMPONENTS IN A POWER SUPPLY SYSTEM

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Chin-Ho Kuo, Taoyuan (TW); Ren-Zhi Zhang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/585,690

(22) Filed: Jan. 27, 2022

(65) Prior Publication Data

US 2023/0240037 A1    Jul. 27, 2023

(51) Int. Cl.
*H05K 7/14*       (2006.01)
*H05K 5/02*       (2006.01)
*H05K 7/02*       (2006.01)

(52) U.S. Cl.
CPC ......... *H05K 7/1489* (2013.01); *H05K 5/0217* (2013.01); *H05K 7/02* (2013.01)

(58) Field of Classification Search
CPC ....... H05K 7/1489; H05K 5/0217; H05K 7/02
See application file for complete search history.

(56) References Cited

U.S. PATENT DOCUMENTS

2019/0074667 A1*  3/2019  Huang ............... H02G 5/025
2020/0068731 A1*  2/2020  Tsorng .............. H05K 5/0221

FOREIGN PATENT DOCUMENTS

TW           376223 U      12/1999

OTHER PUBLICATIONS

TW Office Action for Application No. 111118824, dated Mar. 13, 2023, w/ First Office Action Summary.

* cited by examiner

*Primary Examiner* — Anthony Q Edwards
*Assistant Examiner* — Hung Q Dang
(74) *Attorney, Agent, or Firm* — NIXON PEABODY LLP

(57) ABSTRACT

A power supply system includes a housing having a top cover with a cutout portion formed near a rear end thereof. The cutout portion is configured to mechanically receive, one at a time, either a first bracket or a second bracket to be coupled to the top cover. The first bracket is configured to accommodate a first power supply component. The second bracket is configured to accommodate a second power supply component of a different type than the first power supply component. Each of the first bracket and the second bracket has a length and/or a width greater than a length and a width, respectively, of the cutout portion. Each of the first power supply component and the second power supply component is either a conventional power supply unit, or a busbar adapter sled configured to electrically connect with a busbar cable that supplies power from a remote power source.

15 Claims, 13 Drawing Sheets

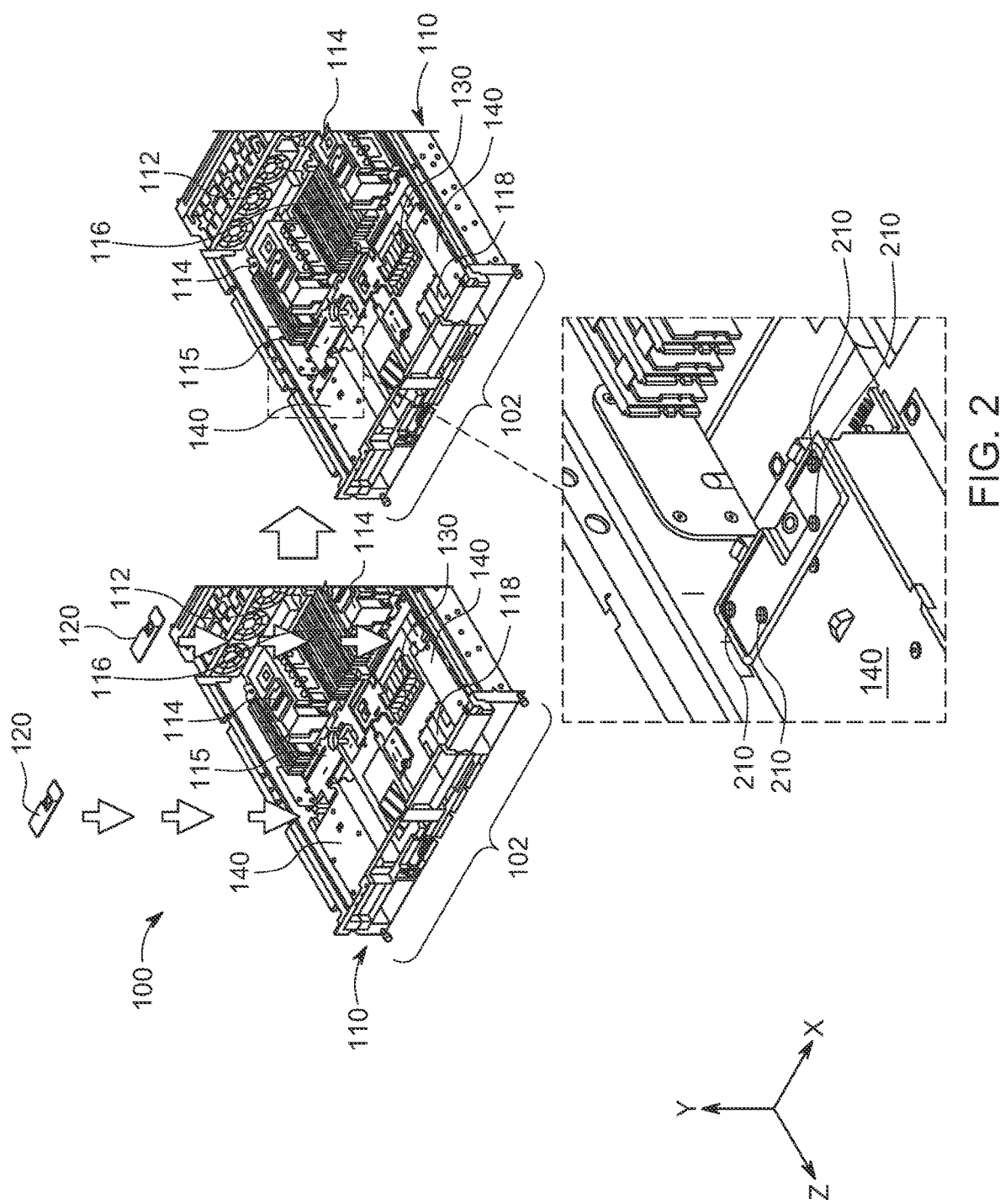

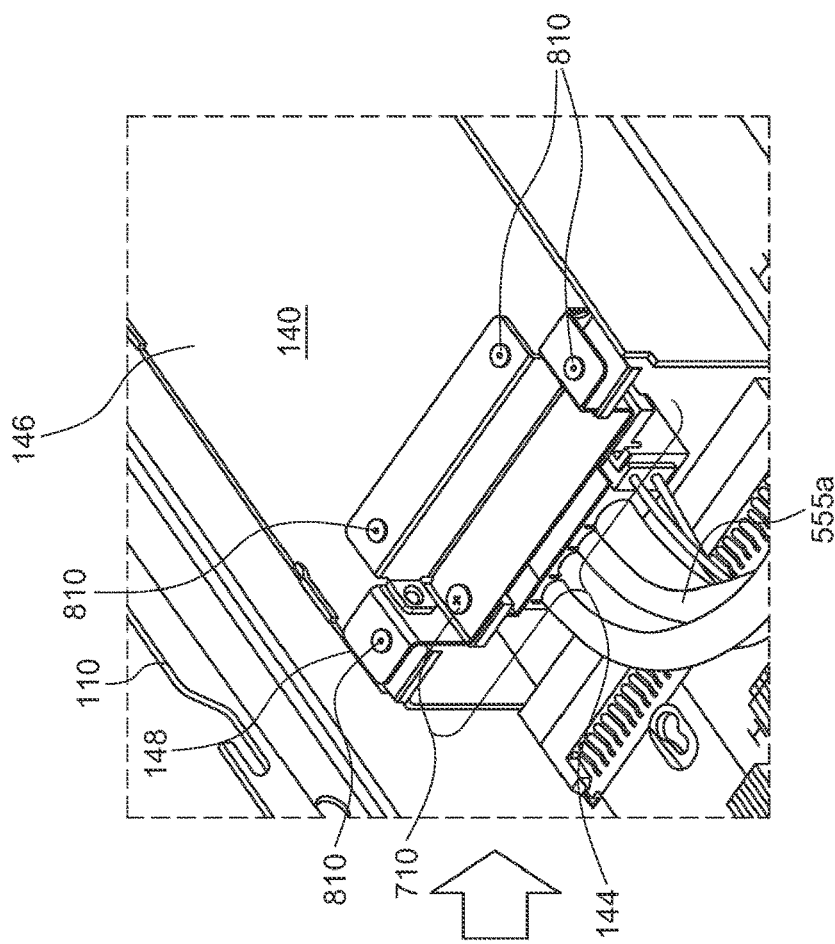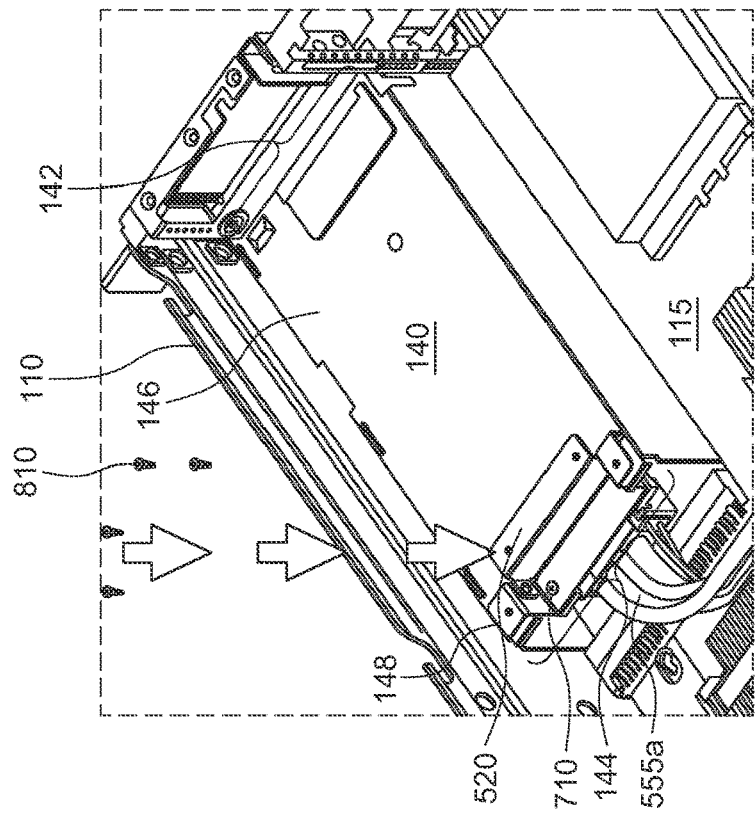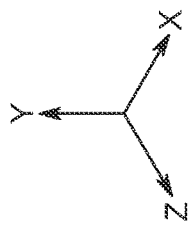
FIG. 8

HOUSING FOR ALIGNING POWER SUPPLY COMPONENTS IN A POWER SUPPLY SYSTEM

FIELD OF THE INVENTION

The present invention relates generally to connecting electrical and mechanical components, and more specifically, to a housing for aligning power supply components in a power supply system that provides power to an electronic assembly such as a server.

BACKGROUND OF THE INVENTION

A server is a specialized computer system that includes numerous electrical and mechanical components integrated into a single unit within an electronic chassis. Common to all servers is a motherboard including one or more printed circuit boards (PCB) and panels having electrical and mechanical components, such as a Graphics Processing Unit (GPU) or a Central Processing Unit (CPU), memory device slots (e.g., DDR3, DDR4, DRAM), PCIe slots), hard drives, a power supply device, and peripherals (e.g., universal serial bus [USB] ports, local area network [LAN], and other input-output [I/O] ports). The power supply device may be different kinds, such as a conventional power supply unit individually housed within the server or a busbar adapter sled configured to electrically connect with busbar cables that supply power from a rack-level power source. Regardless of the kind of power supply device, different configurations may be required for connecting to a housing in the server. It is thus desirable to have adjustable bracket modules that can be configured to align different power supply components in the server.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a power supply system includes a housing having a top cover with a cutout portion formed near a rear end of the top cover. The cutout portion is configured to mechanically receive, one at a time, either a first bracket or a second bracket. The first bracket is configured to be coupled to the top cover and accommodate a first power supply component. The second bracket is configured to be coupled to the top cover and accommodate a second power supply component. The first power supply component is of a different type than the second power supply component.

According to certain aspects of the present disclosure, the cutout portion is generally rectangular.

According to certain aspects of the present disclosure, the first bracket and the second bracket at least has (i) a length greater than a length of the cutout portion, (ii) a width greater than a width of the cutout portion, or (iii) both.

According to certain aspects of the present disclosure, each of the first bracket and the second bracket are formed from a hot dip galvanized steel.

According to certain aspects of the present disclosure, the first power supply component is a conventional power supply unit.

According to certain aspects of the present disclosure, the first bracket is a rectangular plate having at least two inner fastener holes and at least two outer fastener holes for coupling to the top cover of the housing. The first bracket further includes a central channel for accommodating a dowel pin that couples the power supply component to the housing.

According to certain aspects of the present disclosure, the rectangular plate has flanged side walls for protecting hands of an operator of the first bracket.

According to certain aspects of the present disclosure, the second power supply component is a busbar adapter sled configured to electrically connect with a busbar cable that supplies power from a remote power source.

According to certain aspects of the present disclosure, the second bracket includes a first plate and a second plate. The first plate is configured to be coupled to a busbar connector of the busbar cable. The second plate is at an elevated position from the first plate and configured to be coupled to the top cover.

According to certain aspects of the present disclosure, the first plate and the second plate of the second bracket are generally rectangular in shape.

According to certain aspects of the present disclosure, the first plate of the second bracket includes one or more fastener holes for coupling to the busbar connector of the busbar cable.

According to certain aspects of the present disclosure, the second plate includes at least two inner fastener holes for coupling to the top cover of the housing.

According to certain aspects of the present disclosure, the second bracket includes two side brackets adjacent to the first plate and the second plate on each side, each of the two side brackets having at least one outer fastener hole for coupling to the top cover of the housing.

According to certain aspects of the present disclosure, the at least one outer fastener hole is formed through a planar surface of each side bracket, wherein the planar surface disposed at the elevated position.

According to certain aspects of the present disclosure, the first plate, the second plate, and the two side brackets are integrally formed.

According to certain aspects of the present disclosure, a method of changing power supply components in an electronic system is disclosed. The method includes uninstalling a first bracket coupled over a cutout portion formed at or near a rear end of a top cover of a housing having a first power supply component installed therein, and dismounting the first power supply component from the housing. The method further includes installing a second bracket over the cutout portion, and mounting a second power supply component into the housing.

According to certain aspects of the present disclosure, each of the first power supply component and the second power supply component is either (i) a conventional power supply unit, or (ii) a busbar adapter sled configured to electrically connect with a busbar cable that supplies power from a remote power source.

According to certain aspects of the present disclosure, the first bracket and the second bracket at least has (i) a length greater than a length of the cutout portion, (ii) a width greater than a width of the cutout portion, or (iii) both.

According to certain aspects of the present disclosure, when the second power supply component is a busbar adapter sled having a first plate and a second plate at an elevated position from the first plate, installing the second bracket includes mounting the first plate to a busbar connector of the busbar cable and mounting the second plate to the rear end of the top cover of the housing. According to certain aspects of the present disclosure, in such embodiments, the method further includes electrically connecting the busbar adapter sled to the busbar cable.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 2 shows front perspective view of assembling the bracket of FIG. 1B on the power supply system of FIG. 1A, according to certain aspects of the present disclosure.

FIG. 8 shows a top perspective view of assembling the busbar cable with the bracket of FIG. 5B on the power supply system of FIG. 5A, according to certain aspects of the present disclosure.

Figure 1A:
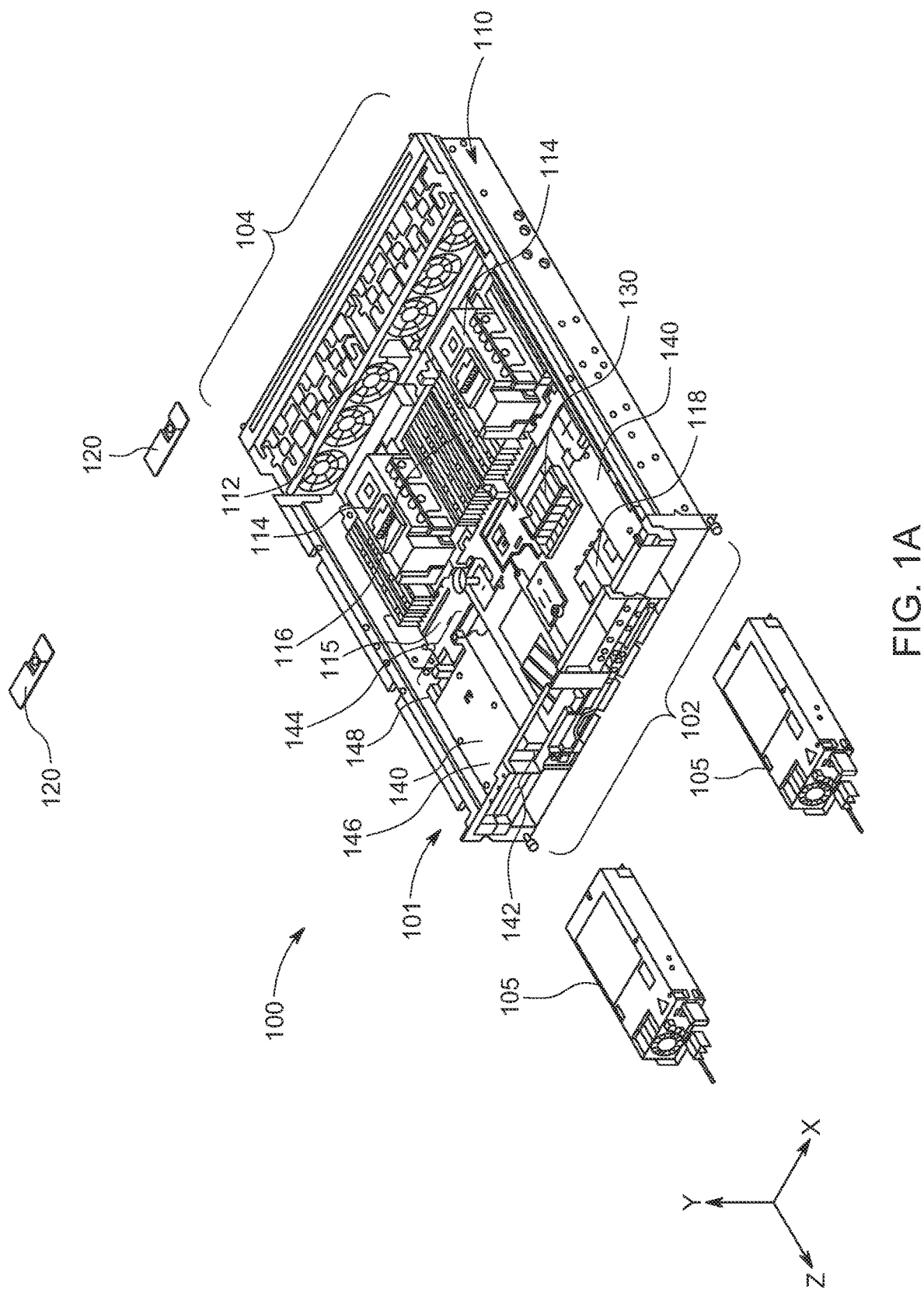
FIG. 1A shows a front perspective view of a power supply system having a bracket for accommodating a conventional power supply unit, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to a power supply system in a server that can be adjusted to accommodate different power supply components, such as a conventional power supply unit and a busbar adapter sled configured to electrically connect with a busbar cable that supplies power from a remote power source. This is achieved through a housing having a cutout portion formed near a rear end of a top cover thereof. The cutout portion is configured to mechanically receive brackets for accommodating different power supply components. The brackets have similar sizes and can be coupled to the top cover to fit over the cutout portion.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to the figures, FIG. 1A shows a front perspective view of a power supply system 100. The power supply system 100 can be placed within an electronic system such as, but not limited to, a server. The power supply system 100 provides electrical power for operation of electronic components within the server. As described in further detail herein, the power supply system 100 is designed to accommodate different kinds of power supply components, such as a conventional power supply unit, a busbar adapter sled configured to electrically connect with the busbar cable, etc.

As shown in FIG. 1A, a chassis 110 of an electronic system 101 has a front end 102 and a rear end 104. The chassis 110 includes a fan module 112 placed near the rear end 104, as well as one or more processors 114, and memory devices 116. The chassis 110 has a printed circuit board (PCB) 115 disposed thereon. A number of electronic components are mounted on the PCB 115, such as a heat sink 130, a network adapter card 118 (e.g., an Open Compute Project (OCP) card), etc.

The power supply system 100 includes a housing 140 mounted on each of the left side and the right side of the PCB 115 near the front end 102 of the chassis 110. The housing 140 has a front end 142, a rear end 144, and a top cover 146 disposed therebetween. As shown in the embodiment of FIG. 1A, the top cover 146 has a cutout portion 148 on the rear end 144. The housing 140 is generally rectangular in shape. The cutout portion 148 is shaped and/or otherwise configured to mechanically receive either a bracket 120 for accommodating a conventional power supply unit 105 (shown in FIGS. 1A-4), or a bracket 520 for accommodating a busbar adapter sled 505 configured to electrically connect with a busbar cable 550 that supplies electrical power from a remote power source (shown in FIGS. 5A-10). The brackets 120, 520 may be formed from a metal or alloy such as, but not limited to, a hot dip galvanized steel.

Figure 1B:
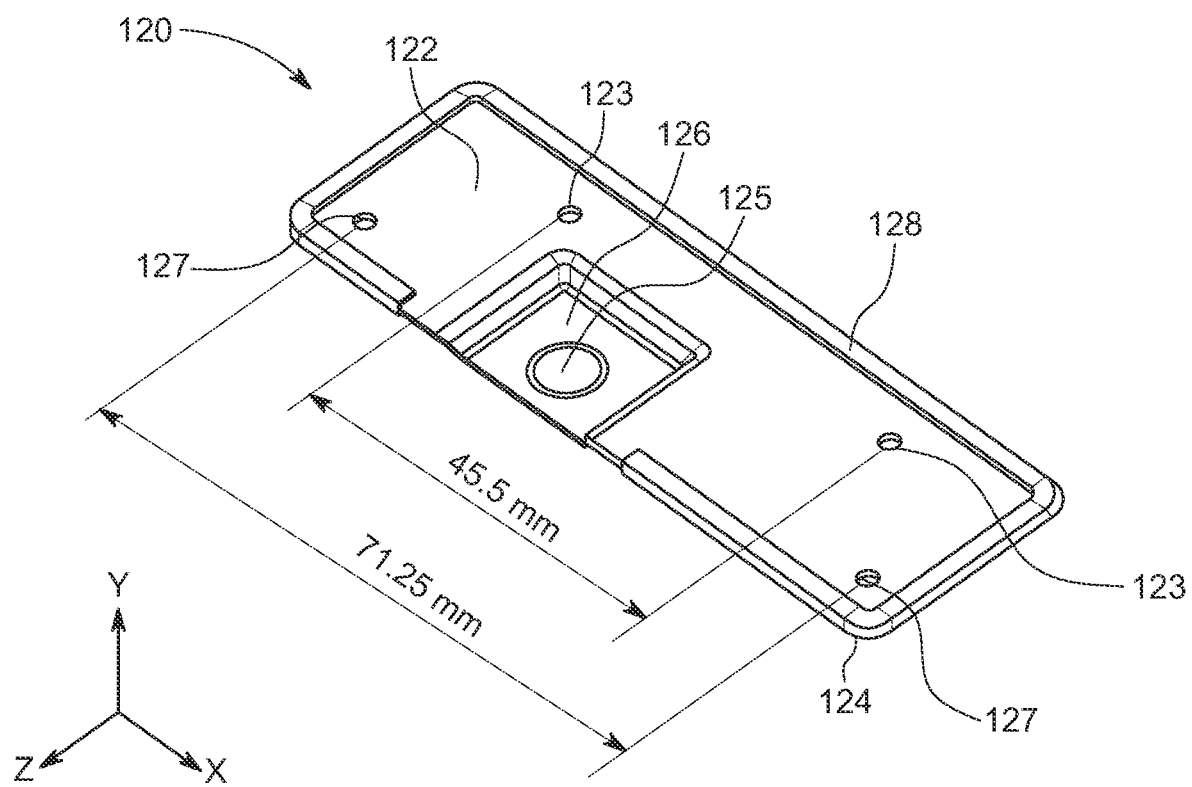
FIG. 1B shows a top perspective view of the bracket for accommodating a conventional power supply unit in the power supply system of FIG. 1A, according to certain aspects of the present disclosure.

FIG. 1B shows a top perspective view of the bracket 120 for accommodating a conventional power supply unit 105 in the power supply system 100. The bracket 120 is configured to be coupled to the top cover 146 at the rear end 144 of the housing 140. The bracket 120 includes a rectangular plate 122. The rectangular plate 122 has flanged side walls 128, which protect hands of an operator using the bracket 120. In the example embodiment shown in FIG. 1B, the bracket 120 includes two inner fastener holes 123 and two outer fastener holes 127 for coupling the bracket 120 to the top cover 146 with screws. The two inner fastener holes 123 are separated by a distance between about 40 mm and about 50 mm, while the two outer fastener holes 127 are separated by a distance between about 65 mm and about 75 mm. In different embodiments, there may be more or less than two inner fastener holes 123 and two outer fastener holes 127.

Further, the bracket 120 includes a central channel 126 having an aperture 125. In the embodiment shown in FIG. 1B, the central channel 126 is adjacent to an edge 124 of the bracket 120 aligned with the rear end 144 of the housing 140. The conventional power supply unit 105 (FIG. 1A) is coupled to the housing 140 through the aperture 125 of the central channel 126 using a dowel pin. In some embodiments, the rectangular plate 122 of the bracket 120 has a length that is greater than the length of the cutout portion 148. Additionally or alternatively, the rectangular plate 122 has a width that is greater than the width of the cutout portion 148.

FIG. 2 shows front perspective view of assembling the bracket 120 on the power supply system 100. As shown in the inset of FIG. 2, four screws 210 are placed through each of the two inner fastener holes 123 and two outer fastener holes 127 of the bracket 120. As a result, the bracket 120 is coupled to the top cover 146 at or near a rear end 144 of the housing 140. The bracket 120 is further pressed against the top cover 146 such that the edge 124 adjacent to the central channel 126 aligns with the rear end 144 of the housing 140.

Figure 3:
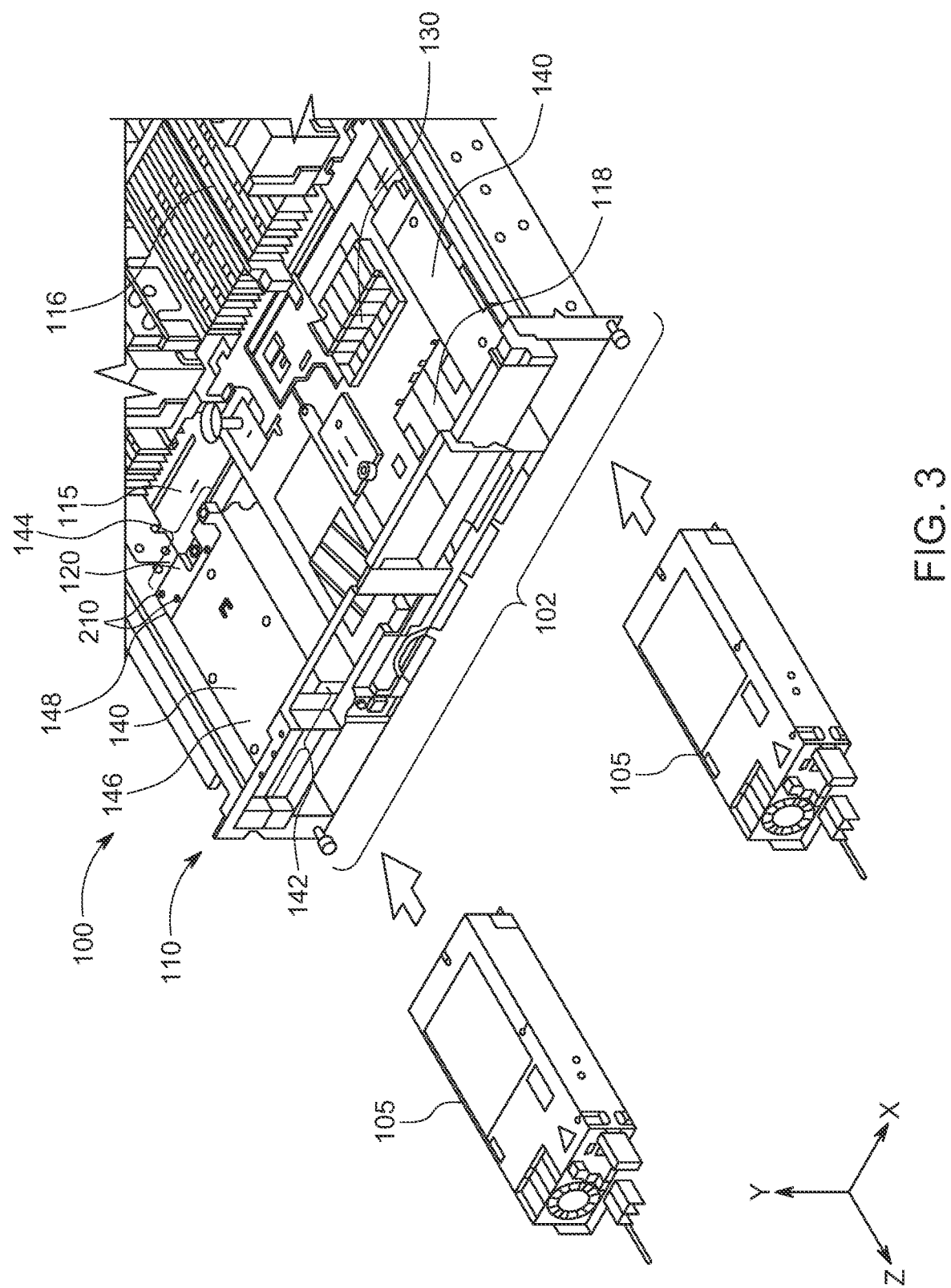
FIG. 3 shows a front perspective view of installing the conventional power supply unit into the power supply system of FIG. 1A, according to certain aspects of the present disclosure.
Figure 4:
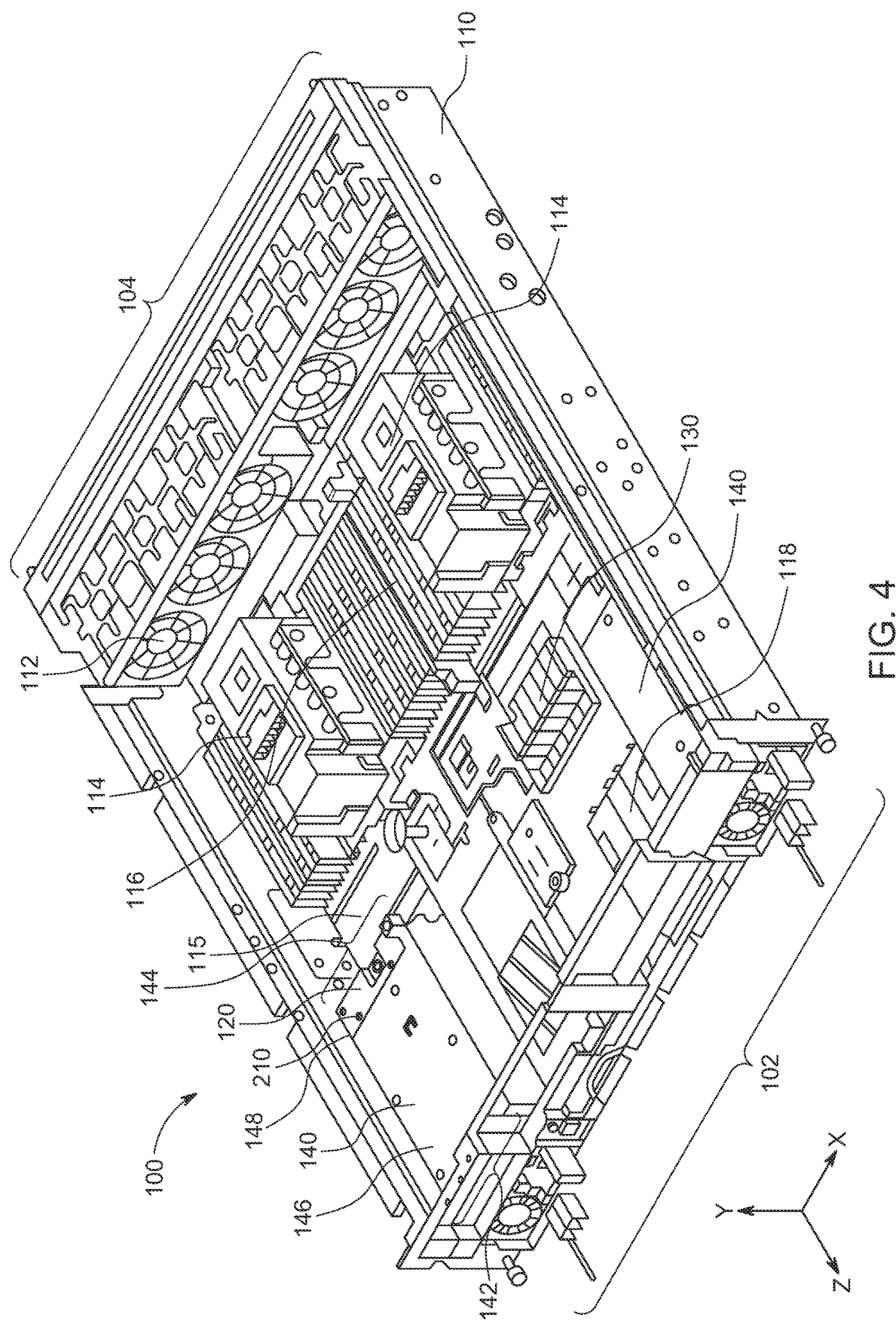
FIG. 4 shows a front perspective view of the power supply system of FIG. 1A configured with the conventional power supply unit, according to certain aspects of the present disclosure.

FIG. 3 shows a front perspective view of installing the conventional power supply unit 105 into the power supply system 100. Once the bracket 120 is aligned with the rear end 144 of the housing 140, the conventional power supply unit 105 is inserted into the housing 140. As discussed above, the conventional power supply unit 105 is coupled to the housing 140 through the aperture 125 of the central channel 126 using a dowel pin. FIG. 4 shows a front perspective view of the power supply system 100 configured with the conventional power supply unit 105. The conventional power supply unit 105 provides electrical power for the electronic components on the chassis 110.

Figure 5A:
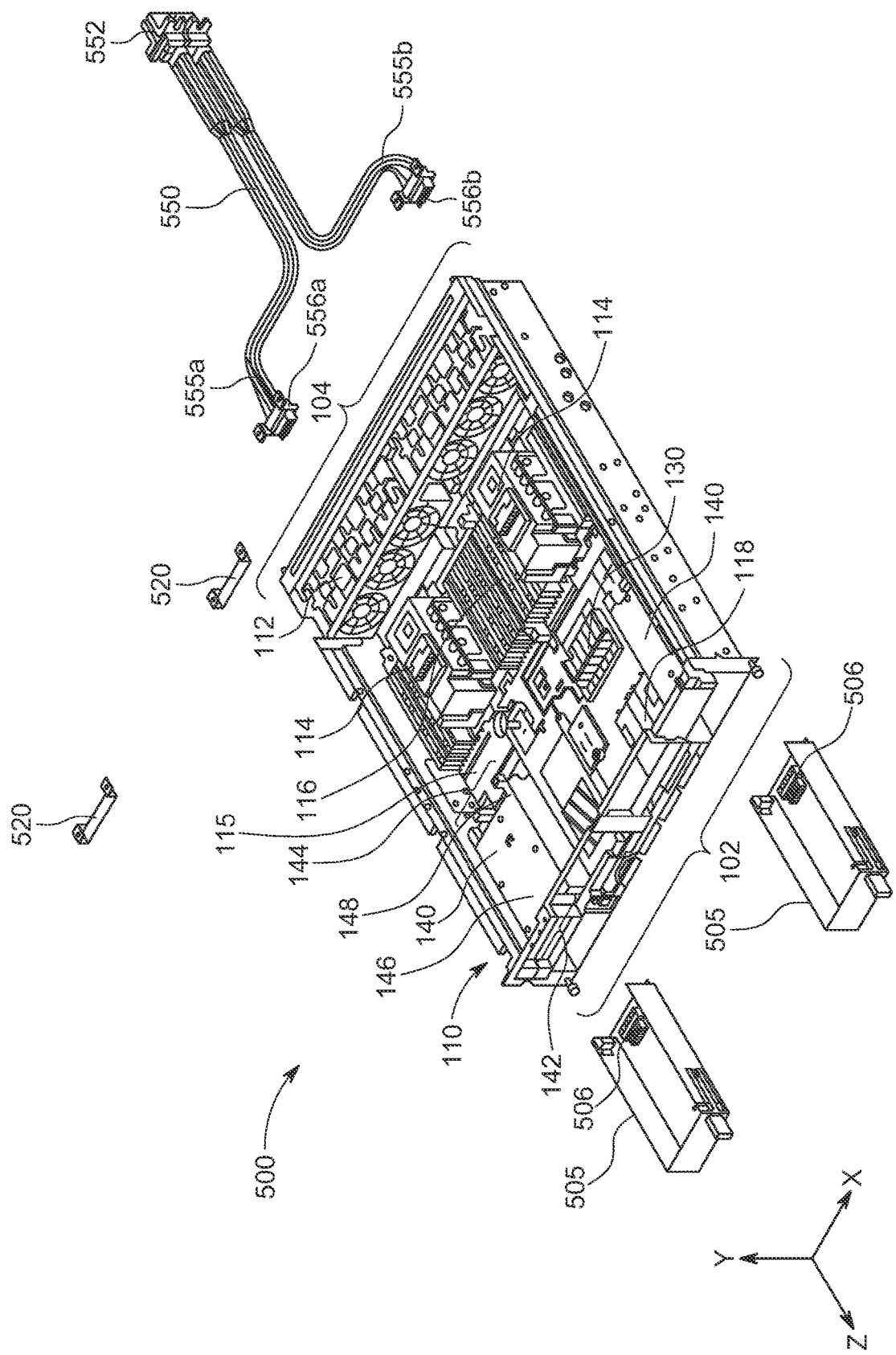
FIG. 5A shows a front perspective view of a power supply system having a bracket for accommodating a busbar adapter sled configured to electrically connect with a busbar cable that supplies power from a remote power source, according to certain aspects of the present disclosure.

FIG. 5A shows a front perspective view of a power supply system 500, which is substantially similar to the power supply system 100. For example, the power supply system 500 includes the chassis 110 having the PCB 115 on which the network adapter card 118, the heat sink 130, and the housing 140 is mounted on the left side and the right side adjacent to the front end 102 of the chassis 110. A fan module 112 and one or more processors 114 and memory devices 116 are also disposed near a rear end 104 of the chassis 110. The housing 140 of the power supply system 500 is configured to accommodate a busbar adapter sled 505 configured to electrically connect with a busbar cable 550 that supplies electric power from a remote power source (not shown). This is achieved by coupling the bracket 520 to the top cover 146 over the cutout portion 148 at the rear end 144 of the housing 140.

As shown in FIG. 5A, the busbar cable 550 includes busbar bracket 552, as well as a left cable set 555a and a right cable set 555b that both emanate from the busbar bracket 552. The left cable set 555a terminates at a left busbar connector 556a. The right cable set 555b terminates at a right busbar connector 556b. The left busbar connector 556a and the right busbar connector 556b are configured to mate with corresponding connectors 506 within each of the busbar adapter sled 505 on the left side and the right side, respectively.

Figure 5B:
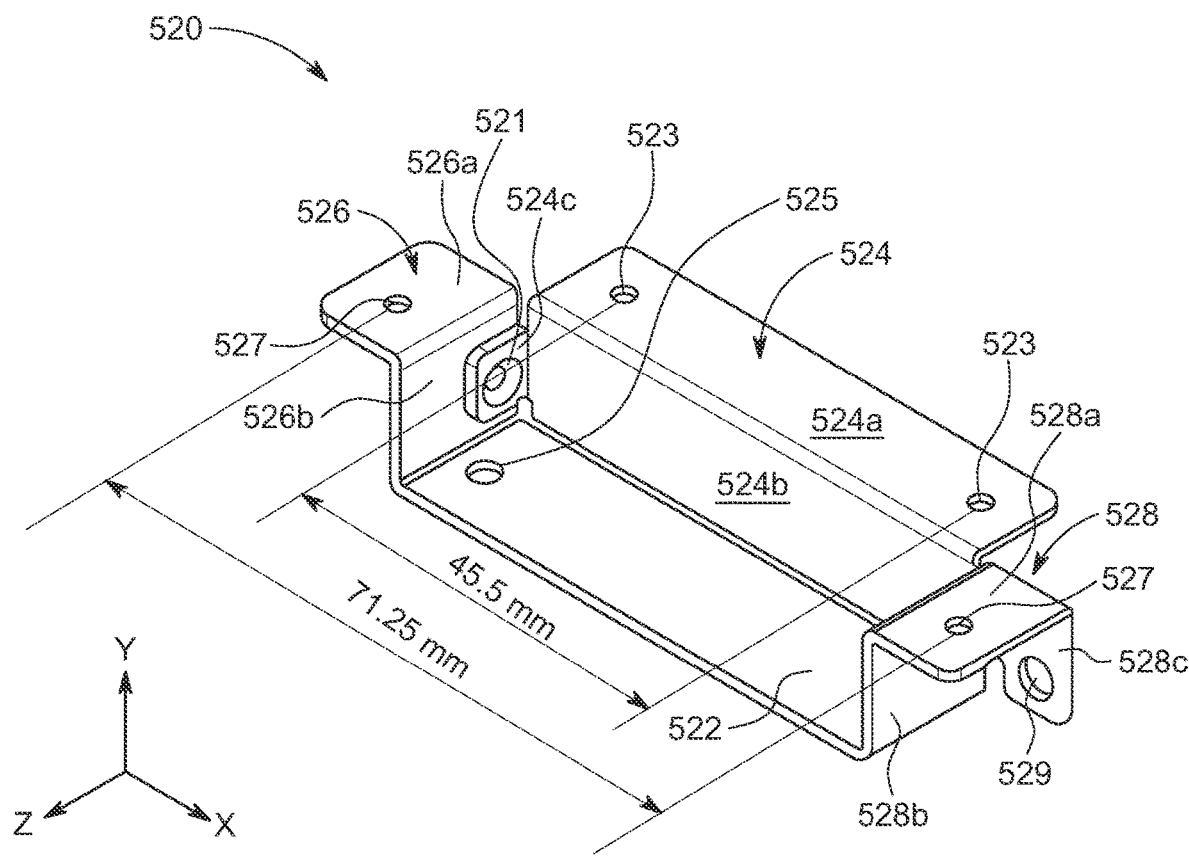
FIG. 5B shows a front perspective view of the bracket for accommodating the busbar adapter sled in the power supply system of FIG. 5A, according to certain aspects of the present disclosure.

FIG. 5B shows a front perspective view of the bracket 520. The bracket 520 has a first plate 522 having one or more fastener holes 525 for coupling the bracket 520 with the left busbar connector 556a or the right busbar connector 556b. The first plate 522 is connected to a second plate 524 disposed at an elevated position from the first plate 522. The second plate 524 is configured to be coupled to the top cover 146 at the rear end 144 of the housing 140 (FIG. 5A), as discussed below. The second plate 524 has a horizontal top surface 524a and a vertical surface 524b, which includes a first ear portion 524c having an opening 521. The first plate 522 is connected to the second plate 524, through the vertical surface 524b. The horizontal top surface 524a includes two inner fastener holes 523 for coupling the bracket 120 to the top cover 146 with screws. The two inner fastener holes 523 are separated by a distance between about 40 mm and about 50 mm. In different embodiments, there may be more or less than two inner fastener holes 523.

The second bracket 520 further includes a left side bracket 526 and a right side bracket 528. The left side bracket 526 and the right side bracket 528 are adjacent to the first plate 522 and the second plate 524 on the left side and the right side, respectively. The first plate 522, the second plate 524, and the side brackets 526, 528 are generally rectangular in shape. In some embodiments, the first plate, the second plate 524, and the side brackets 526, 528 are integrally formed.

The left side bracket 526 includes a horizontal top surface 526a and a vertical surface 526b. The left side bracket 526 is connected to the first plate 522 through the vertical surface 526b. The vertical surface 526b of the left side bracket 526 is connected to the vertical surface 524b of the second plate 524 through the opening 521 on the first ear portion 524c. The horizontal top surface 526a is a planar surface disposed at the same elevated position as the second plate 524. The horizontal top surface 526a includes one or more outer fastener holes 527, which couple the left side bracket 526 to the top cover 146 of the housing 140.

The right side bracket 528 includes a horizontal top surface 528a, a vertical surface 528b, and a second ear portion 528c having a guide hole 529 for coupling to the busbar adapter sled 505 (FIG. 5A) with a dowel pin. The right side bracket 528 is connected to the first plate 522 through the vertical surface 528b. The horizontal top surface 528a is a planar surface disposed at the same elevated position as the second plate 524. The horizontal top surface 528a includes one or more outer fastener holes 527, which couple the right side bracket 528 to the top cover 146 of the housing 140. Thus, the outer fastener hole(s) 527 on the horizontal top surfaces 526a, 528a are disposed at the same elevated position as the inner fastener hole(s) 523. The two outer fastener holes 527 are separated by a distance between about 65 mm and about 75 mm. In different embodiments, there may be more or less than two outer fastener holes 527.

Figure 6:
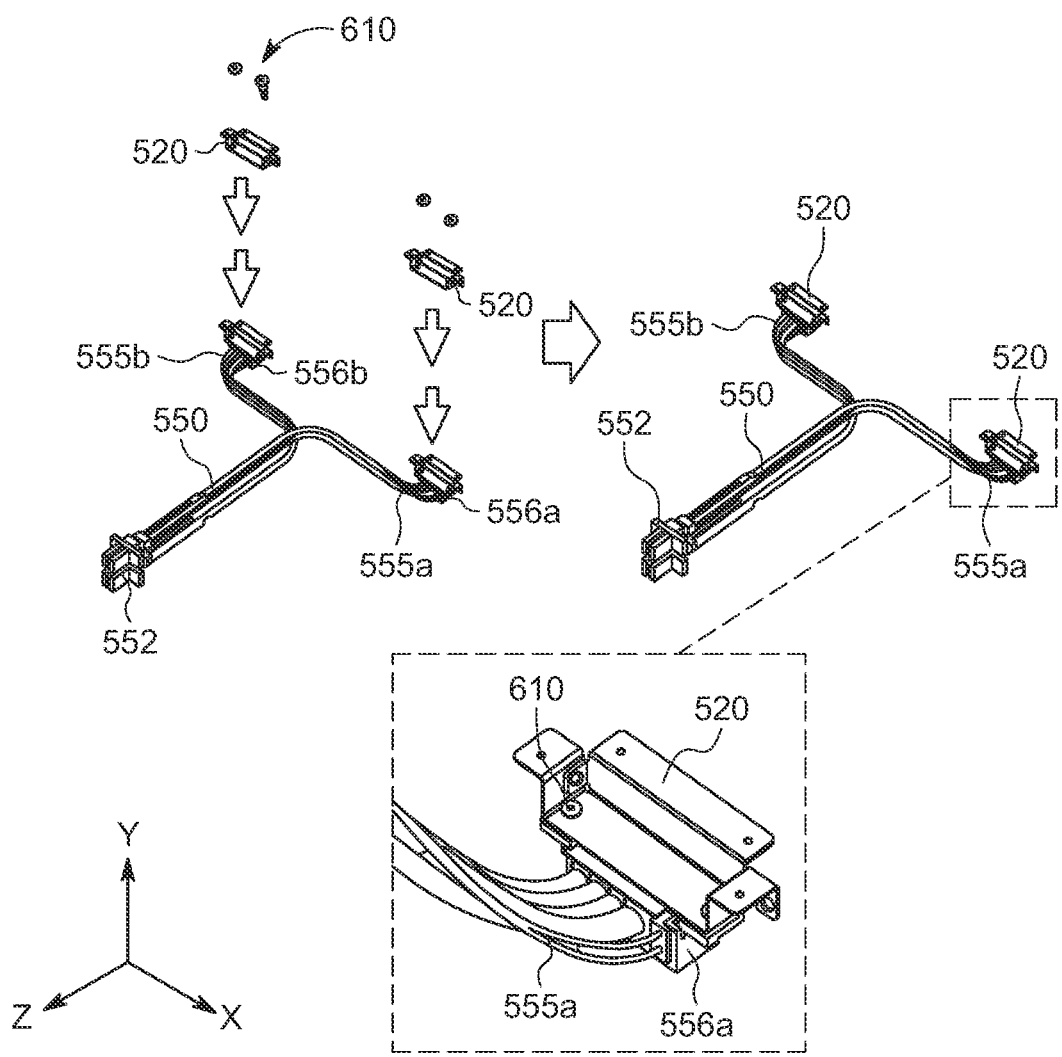
FIG. 6 shows a front perspective view of assembling the bracket of FIG. 5B on the busbar cable that electrically connects to the busbar adapter sled of FIG. 5A, according to certain aspects of the present disclosure.

FIG. 6 shows a front perspective view of assembling the bracket 520 on the busbar cable 550. As discussed above, the busbar cable 550 electrically connects to the busbar adapter sled 505 (FIG. 5A). Screws 610 are placed through the fastener holes 525 (FIG. 5B) on the first plate of each bracket 520 that connects with the left busbar connector 556a or the right busbar connector 556b. This couples the bracket 520 to the left busbar connector 556a and the right busbar connector 556b of the busbar cable 550.

Figure 7:
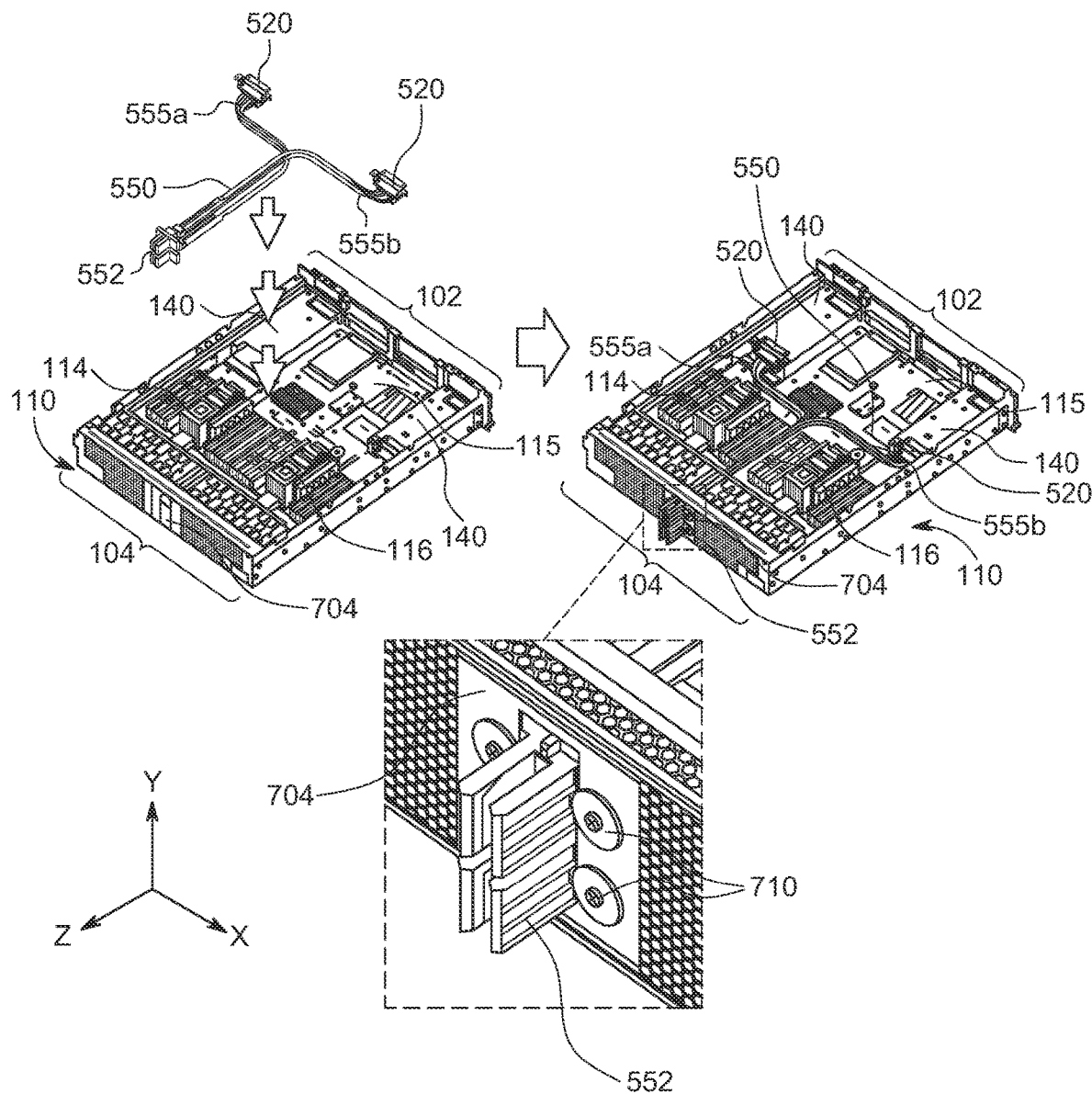
FIG. 7 shows a front perspective view of assembling the busbar cable of FIG. 6 in the power supply system of FIG. 5A, according to certain aspects of the present disclosure.

FIG. 7 shows a front perspective view of assembling the busbar cable 550 in the power supply system 500 (FIG. 5A). The busbar bracket 552 is attached to a gate 704 at the rear end of the chassis 110 using screws 710. The busbar cable 550 is passed through and around the memory devices 116 and the processors 114 in the chassis 110. The busbar cable 550 splits into the left cable set 555a and the right cable set 555b. The left cable set 555a and the right cable set 555b connect with the housing 140 on each of the left side and right side of the chassis 110, respectively.

FIG. 8 shows a top perspective view of assembling the busbar cable 550 (FIG. 5A) with the bracket 520 on the power supply system 500 (FIG. 5A). Screws 810 are placed through the inner fastener holes 523 and the outer fastener holes 527 of the second bracket 520. As a result, the bracket 520 is coupled to the top cover 146 over the cutout portion 148 (FIG. 5A). The bracket 520 is further pressed against the top cover 146 such that the first plate 522 (FIG. 5B) hangs under the second plate 524 (FIG. 5B) at a height that aligns the left cable set 555a and the right cable set 555b to mate with the corresponding connectors 506 (FIG. 5A) on each of the busbar adapter sled 505 on the left side and the right side respectively.

Figure 9:
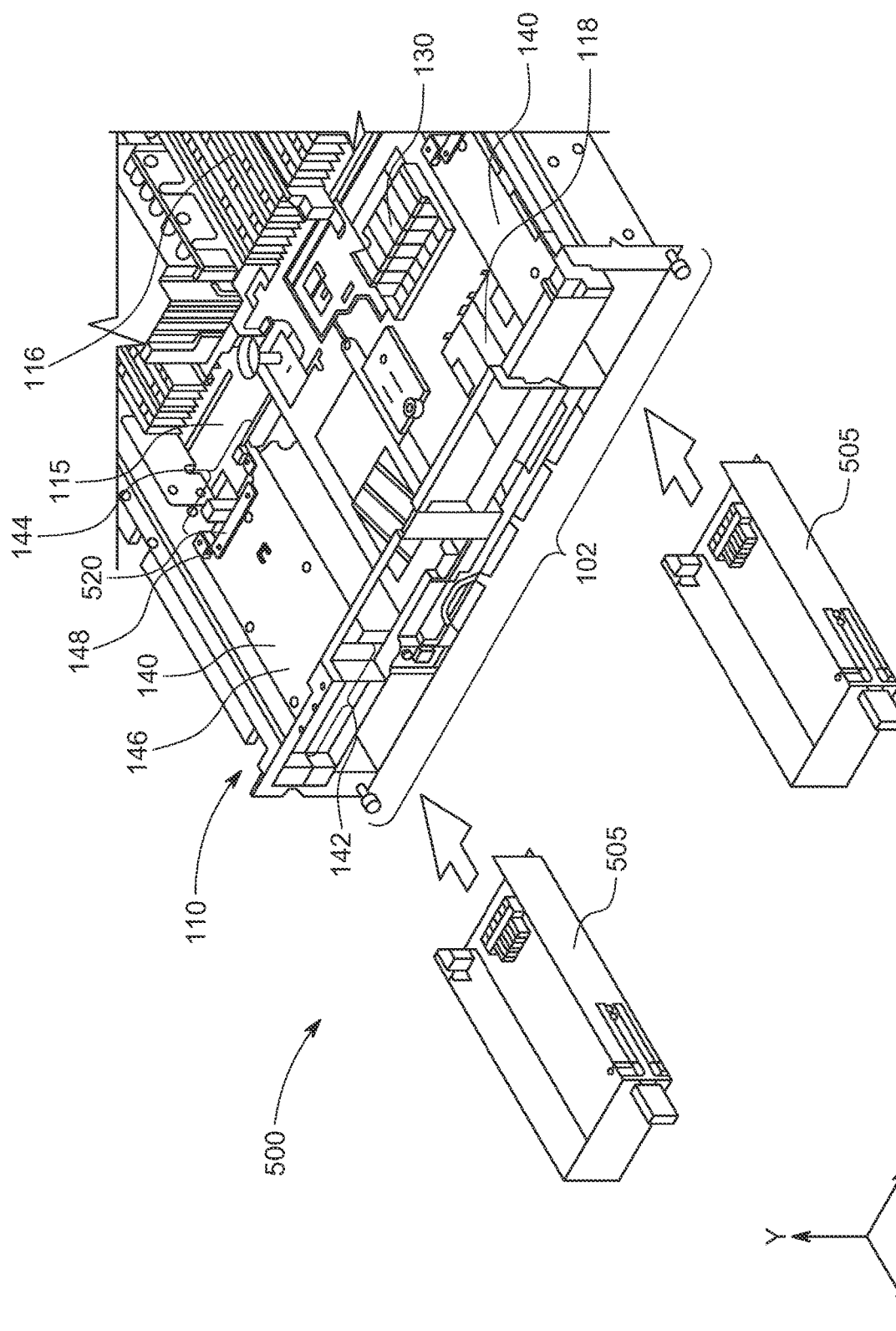
FIG. 9 shows a front perspective view of installing the busbar adapter sled of FIG. 5A into the power supply system of FIG. 5A, according to certain aspects of the present disclosure.
Figure 10:
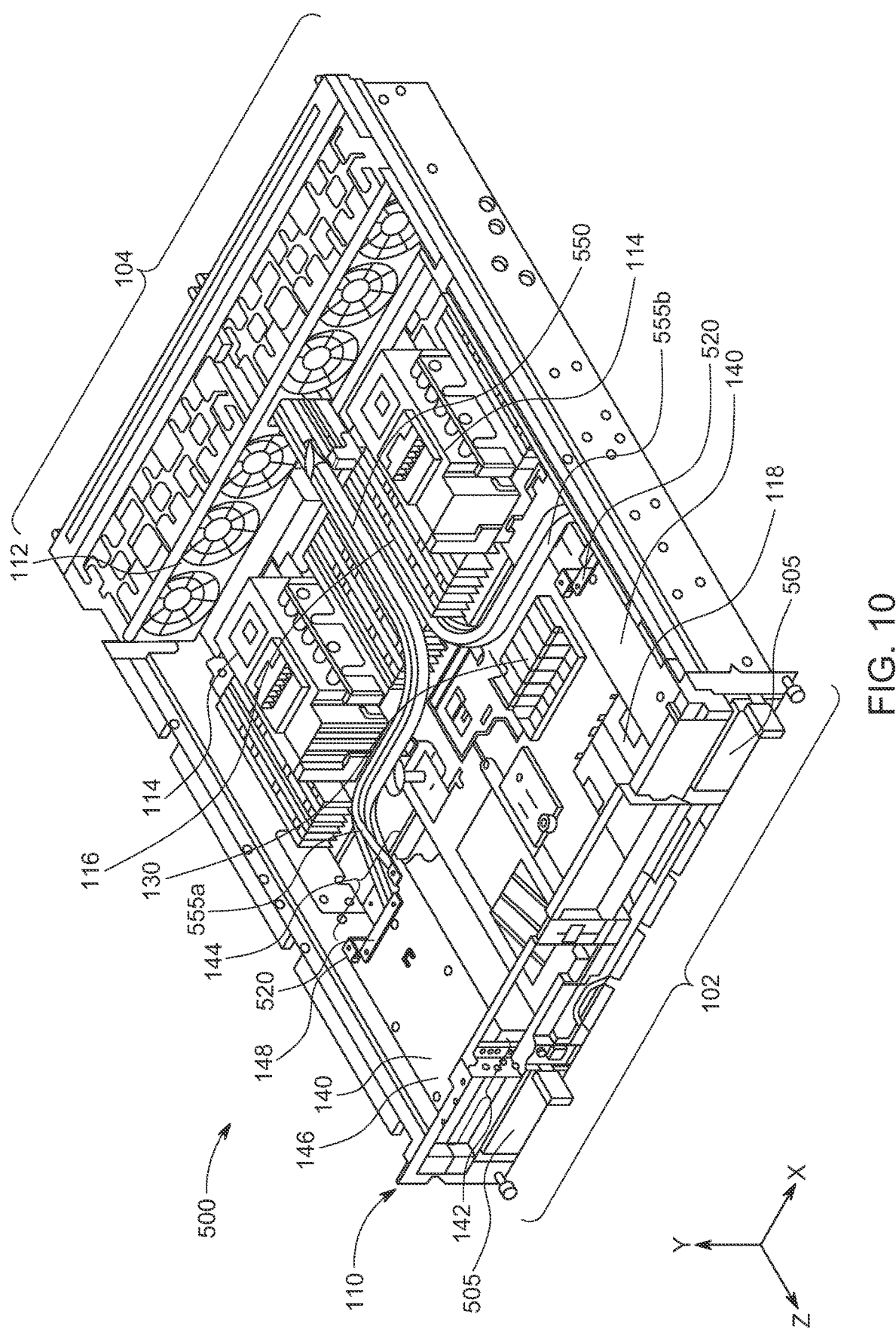
FIG. 10 shows a front perspective view of the power supply system of FIG. 1A configured with the busbar cable electrically connected to the busbar adapter sled, according to certain aspects of the present disclosure.

FIG. 9 shows a front perspective view of installing the busbar adapter sled 505 into the power supply system 500. Once the bracket 520 is coupled to and aligned with the rear end 144 of the housing 140, the busbar adapter sled 505 is inserted into the housing 140. As discussed above, each of the busbar adapter sled 505 on the left side and the right side connects with the left cable set 555a and the right cable set 555b of the busbar cable 550. FIG. 10 shows a front perspective view of the power supply system 500 configured with the busbar cable 550 electrically connected to the busbar adapter sled 505. The busbar adapter sled 505 connects with the busbar cable 550 that supplies electrical power from a remote power source for the electronic components on the chassis 110.

Figure 11:
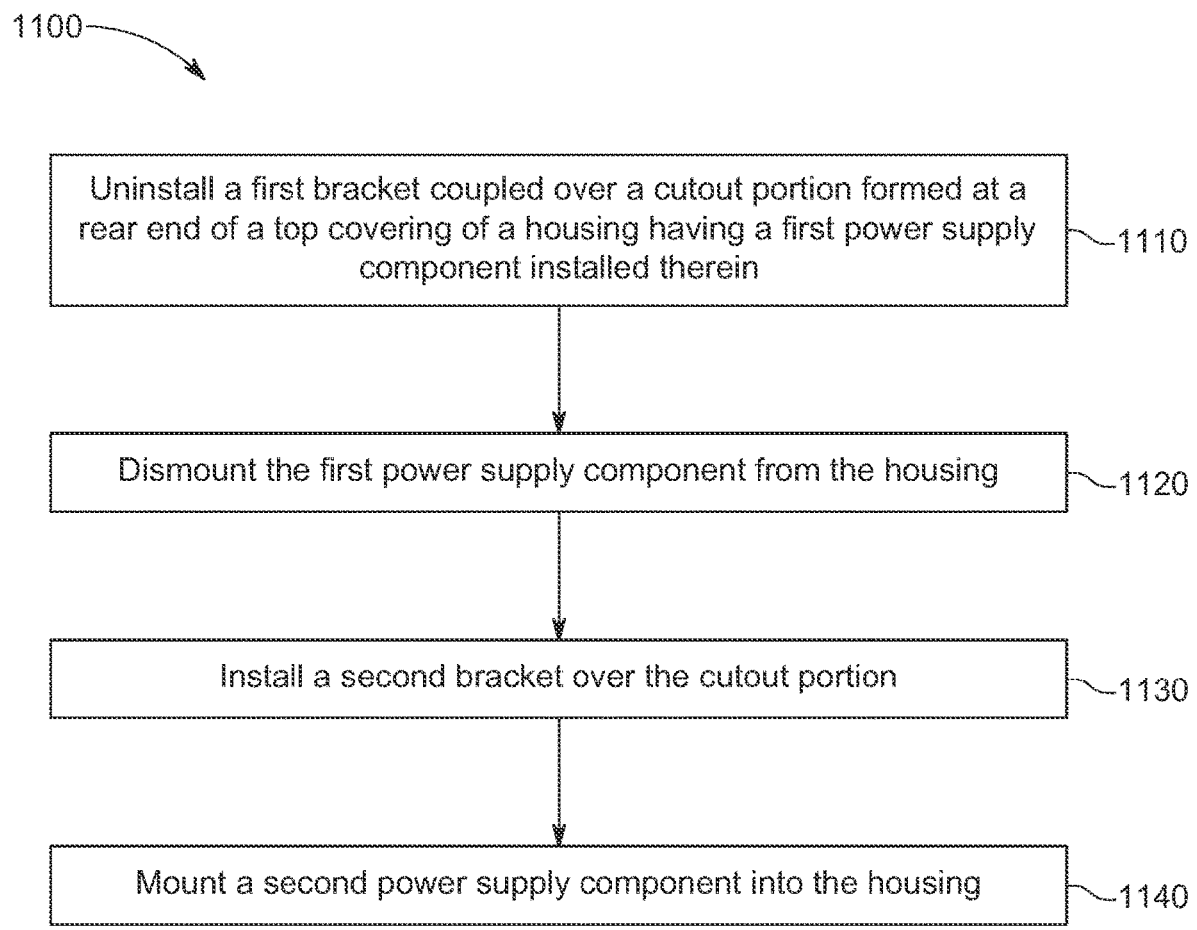
FIG. 11 shows a block diagram of a method of changing power supply components in an electronic system using the brackets of FIG. 1B and FIG. 5B, according to certain aspects of the present disclosure.

FIG. 11 shows a block diagram of a method 1100 of changing power supply components in a housing of a power supply system using the bracket 120 (FIG. 1B) and the bracket 520 (FIG. 5B). The brackets 120, 520 are coupled over a cutout portion formed at or near a rear end of a top cover of the housing. The bracket 120 is designed to accommodate a conventional power supply unit, and the bracket 520 is designed to accommodate a busbar adapter sled that connects with a busbar cable to supply electrical power from a remote power source. As described above, the brackets have a length greater than a length of the cutout portion, a width greater than a width of the cutout portion, or both.

The method 1100 begins with block 1110, where a first bracket coupled over the cutout portion is uninstalled. The housing has a first power supply component installed therein, when the first bracket is installed. In some embodiments, the first bracket may be the bracket 120 of FIG. 1B, when a conventional power supply unit is installed. In other embodiments, the first bracket may be the bracket 520 of the FIG. 5B, when a busbar adapter sled is installed.

In block 1120, the first power supply component is dismounted from the housing. In embodiments where the first bracket is the bracket 120, this means that the conventional power supply unit is dismounted. In embodiments where the first bracket is the bracket 520, this means that the busbar adapter sled is dismounted.

In block 1130, a second bracket is installed over the cutout portion formed at the rear end of the top cover of the housing. In embodiments where the first bracket is the bracket 120, this means that the second bracket installed over the cutout portion is the bracket 520 of FIG. 5B. In embodiments where the first bracket is the bracket 520, this means that the second bracket installed over the cutout portion is the bracket 120 of FIG. 1B.

Finally, in block 1140, the second power supply component is mounted into the housing. In embodiments where the second bracket is the bracket 520 of FIG. 5B, this means that the busbar adapter sled is mounted into the housing. Further in such embodiments, the busbar adapter sled is then electrically connected to the busbar cable. As described above, installing the second bracket in block 1130, in such embodiments, includes mounting a first plate to a busbar connector of the busbar cable and mounting a second plate to the rear end of the top cover of the housing. In embodiments where the second bracket is the bracket 120 of FIG. 1B, this means that the conventional power supply unit is mounted into the housing.

Embodiments of the brackets described herein can be advantageously used to align different power supply components within a housing of a power supply system that provides power to electronic components of a server. In particular, the brackets are configured to fit over a single cutout portion of a top cover of a housing in the power supply system and thereby accommodate the different power supply components. This ensures that the power supply system within a server chassis does not have to be redesigned to accommodate a different power supply component.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A power supply system comprising:
 a housing having a top cover with a cutout portion formed near a rear end of the top cover, the cutout portion configured to mechanically receive, one at a time, either a first bracket or a second bracket,
 wherein:
  the first bracket is configured to be coupled to the top cover and accommodate a first power supply component that is a conventional power supply unit, the first bracket being a rectangular plate including
   at least two inner fastener holes and at least two outer fastener holes for coupling to the top cover of the housing, and
   a central channel for accommodating a dowel pin that couples the first power supply component to the housing; and
  the second bracket is configured to be coupled to the top cover and accommodate a second power supply component, the second power supply component being a busbar adapter sled configured to electrically connect with a busbar cable that supplies power from a remote power source.

2. The power supply system of claim 1, wherein the cutout portion is generally rectangular.

3. The power supply system of claim 1, wherein each of the first bracket and the second bracket has (i) a length greater than a length of the cutout portion, (ii) a width greater than a width of the cutout portion, or (iii) both.

4. The power supply system of claim 1, wherein each of the first bracket and the second bracket are formed from a hot dip galvanized steel.

5. The power supply system of claim 1, wherein the rectangular plate has flanged side walls for protecting hands of an operator of the first bracket.

6. A power supply system comprising:
 a housing having a top cover with a cutout portion formed near a rear end of the top cover, the cutout portion configured to mechanically receive, one at a time, either a first bracket or a second bracket,
 wherein:
  the first bracket is configured to be coupled to the top cover and accommodate a first power supply component that is a conventional power supply unit; and
  the second bracket is configured to be coupled to the top cover and accommodate a second power supply component, the second power supply component being a busbar adapter sled configured to electrically connect with a busbar cable that supplies power from a remote power source, the second bracket including
   a first plate configured to be coupled to a busbar connector of the busbar cable; and
   a second plate at an elevated position from the first plate, the second plate configured to be coupled to the top cover.

7. The power supply system of claim 6, wherein the first plate and the second plate are generally rectangular in shape.

8. The power supply system of claim 6, wherein the first plate includes one or more fastener holes for coupling to the busbar connector of the busbar cable.

9. The power supply system of claim 6, wherein the second plate includes at least two inner fastener holes for coupling to the top cover of the housing.

10. The power supply system of claim 6, wherein the second bracket includes two side brackets adjacent to the first plate and the second plate on each side, each of the two side brackets having at least one outer fastener hole for coupling to the top cover of the housing.

11. The power supply system of claim 10, wherein the at least one outer fastener hole is formed through a planar surface of each side bracket, the planar surface disposed at the elevated position.

12. The power supply system of claim 10, wherein the first plate, the second plate, and the two side brackets are integrally formed.

13. A method of changing power supply components in an electronic system, the method comprising:
 uninstalling a first bracket coupled to a rear end of a top cover of a housing having a first power supply component installed therein;
 dismounting the first power supply component from the housing;
 installing a second bracket over a cutout portion formed on the rear end of the top cover of the housing; and
 mounting a second power supply component into the housing;
 wherein the first bracket and the second bracket at least has (i) a length greater than a length of the cutout portion, (ii) a width greater than a width of the cutout portion, or (iii) both; and wherein when the second power supply component is a busbar adapter sled having a first plate and a second plate at an elevated position from the first plate, installing the second bracket includes mounting the first plate to a busbar connector of the busbar cable and mounting the second plate to the rear end of the top cover of the housing.

14. The method of claim 13, wherein each of the first power supply component and the second power supply component is either (i) a conventional power supply unit, or (ii) the busbar adapter sled.

15. The method of claim 13, further comprising electrically connecting the busbar adapter sled to the busbar cable.

\* \* \* \* \*